United States Patent
Feng et al.

(10) Patent No.: US 11,127,621 B2
(45) Date of Patent: Sep. 21, 2021

(54) METHOD OF FORMING SEMICONDUCTOR DEVICE

(71) Applicant: UNITED MICROELECTRONICS CORP., Hsin-Chu (TW)

(72) Inventors: Ji Feng, Singapore (SG); Yunfei Li, Singapore (SG); Guohai Zhang, Singapore (SG); Ching Hwa Tey, Singapore (SG); Jingling Wang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 45 days.

(21) Appl. No.: 16/673,929

(22) Filed: Nov. 4, 2019

(65) Prior Publication Data
US 2021/0134653 A1    May 6, 2021

(51) Int. Cl.
*H01L 21/762* (2006.01)
*H01L 21/76* (2006.01)
*H01L 21/311* (2006.01)
*H01L 21/265* (2006.01)

(52) U.S. Cl.
CPC .... *H01L 21/76224* (2013.01); *H01L 21/2652* (2013.01); *H01L 21/31111* (2013.01); *H01L 21/31144* (2013.01); *H01L 21/76283* (2013.01)

(58) Field of Classification Search
CPC ......... H01L 21/76224; H01L 21/76283; H01L 27/1203; H01L 21/02255; H01L 21/31053
See application file for complete search history.

(56) References Cited

U.S. PATENT DOCUMENTS

| | | | |
|---|---|---|---|
| 5,888,861 A * | 3/1999 | Chien | H01L 21/8249 257/E21.696 |
| 5,966,614 A * | 10/1999 | Park | H01L 21/76232 438/401 |
| 6,541,351 B1 * | 4/2003 | Bartlau | H01L 21/31105 257/E21.564 |
| 6,893,937 B1 * | 5/2005 | Gu | H01L 21/76224 257/E21.507 |
| 7,002,214 B1 | 2/2006 | Boyd et al. | |
| 2005/0090047 A1 * | 4/2005 | Hawley | H01L 21/76237 438/197 |

* cited by examiner

*Primary Examiner* — Bradley Smith
*Assistant Examiner* — David J Goodwin
(74) *Attorney, Agent, or Firm* — Winston Hsu

(57) ABSTRACT

A method of forming a semiconductor device includes following steps. Firstly, a substrate is provided and the substrate has a first semiconductor layer formed thereon. Next, an isolating structure is formed in the first semiconductor layer, and a sacrificial layer is formed on the first semiconductor layer by consuming a top portion of the first semiconductor layer. Then, the sacrificial layer is removed to form a second semiconductor layer, and a portion of the isolating structure is also removed to form a shallow trench isolation (STI), with a top surface of the shallow trench isolation being substantially coplanar with a top surface of the second semiconductor layer.

14 Claims, 6 Drawing Sheets

METHOD OF FORMING SEMICONDUCTOR DEVICE

BACKGROUND OF THE INVENTION

1. Field of the Invention

The present invention relates to a method of forming a semiconductor device, and more particularly, to a method of forming a semiconductor device with a thin-down substrate.

2. Description of the Prior Art

In semiconductor front-end processes, a shallow trench isolation (STI) technique is commonly used to provide sufficient isolation between electrical devices on a wafer. A typical STI process involves the formation of shallow trenches surrounding an active island, referred to as "active area", on the wafer, followed by the filling in of the trenches with an insulating material to obtain electrical isolation effects. Due to an increasing demand in the integration density of the semiconductor device fabricated on the wafer, the fabrications thereof are requested to be improved and constantly enhanced thereby for fabricating semiconductor device with a smaller size and a higher quality at the same time. Thus, the currently STI process may encounter numerous problems and an optimized approach is urgent needed thereby.

SUMMARY OF THE INVENTION

One of the objectives of the present invention provides a method of forming a semiconductor device, in which the forming steps thereof are sufficiently simplified to reduce the cost, and the device obtained thereby is in good uniformity.

To achieve the purpose described above, one embodiment of the present invention provides a method of forming a semiconductor device includes following steps. Firstly, a substrate is provided and the substrate has a first semiconductor layer formed thereon. Next, an isolating structure is formed in the first semiconductor layer, and a sacrificial layer is formed on the first semiconductor layer by consuming a top portion of the first semiconductor layer. Then, the sacrificial layer is removed to form a second semiconductor layer, and a portion of the isolating structure is also removed to form a shallow trench isolation (STI), with a top surface of the shallow trench isolation being substantially coplanar with a top surface of the second semiconductor layer.

Overall speaking, the method of the present embodiment integrates the thinning-down process of the semiconductor layer with the formation of other elements such as a sacrificial layer, so that, the process flow of the present method may be sufficiently simplified and the cost thereof may be reduced thereby.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 are schematic diagrams illustrating a method of forming a semiconductor device according to a first preferred embodiment of the present invention, wherein:

FIG. 1 shows a cross-sectional view of a semiconductor device after forming an isolating layer in a trench;

FIG. 2 shows a cross-sectional view of a semiconductor device after performing an etching back process on the isolating layer;

FIG. 3 shows a cross-sectional view of a semiconductor device after performing an implanting process; and FIG. 4 shows a cross-sectional view of a semiconductor device after performing an etching process.

FIG. 5 to FIG. 9 are schematic diagrams illustrating a method of forming a semiconductor device according to a second preferred embodiment of the present invention, wherein:

FIG. 5 shows a cross-sectional view of a semiconductor device after performing an etching back process on an isolating layer;

FIG. 6 shows a cross-sectional view of a semiconductor device after removing a mask structure;

FIG. 7 shows a cross-sectional view of a semiconductor device after forming a sacrificial layer;

FIG. 8 shows a cross-sectional view of a semiconductor device after performing an etching process; and FIG. 9 shows a cross-sectional view of a semiconductor device after forming a transistor.

FIG. 10 to FIG. 11 are schematic diagrams illustrating a method of forming a semiconductor device according to a third preferred embodiment of the present invention, wherein:

FIG. 10 shows a cross-sectional view of a semiconductor device after performing an etching back process on an isolating layer; and FIG. 11 shows a cross-sectional view of a semiconductor device after forming a sacrificial layer.

DETAILED DESCRIPTION

To provide a better understanding of the presented invention, preferred embodiments will be described in detail. The preferred embodiments of the present invention are illustrated in the accompanying drawings with numbered elements.

Figure 1:
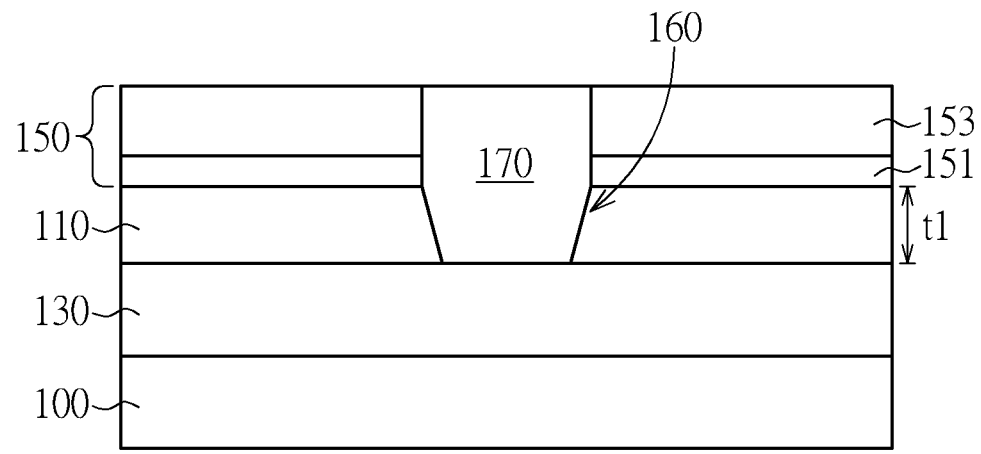
Figure 2:
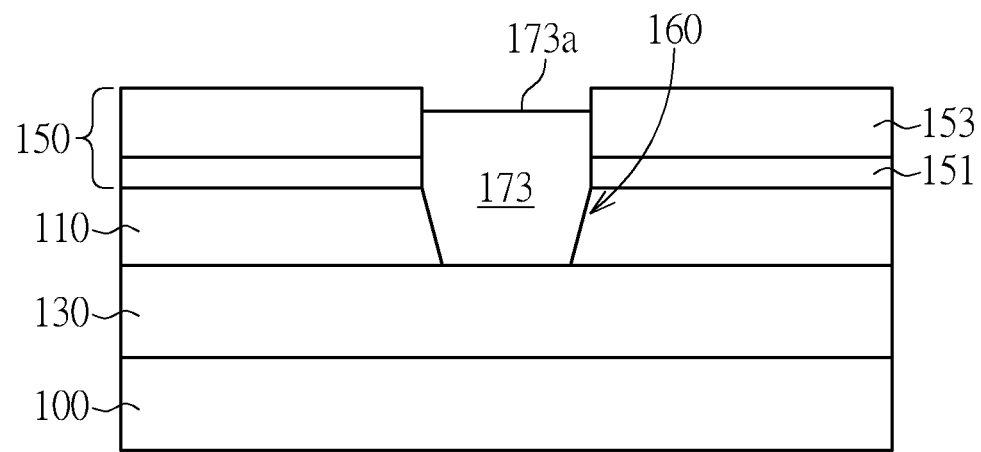
Figure 3:
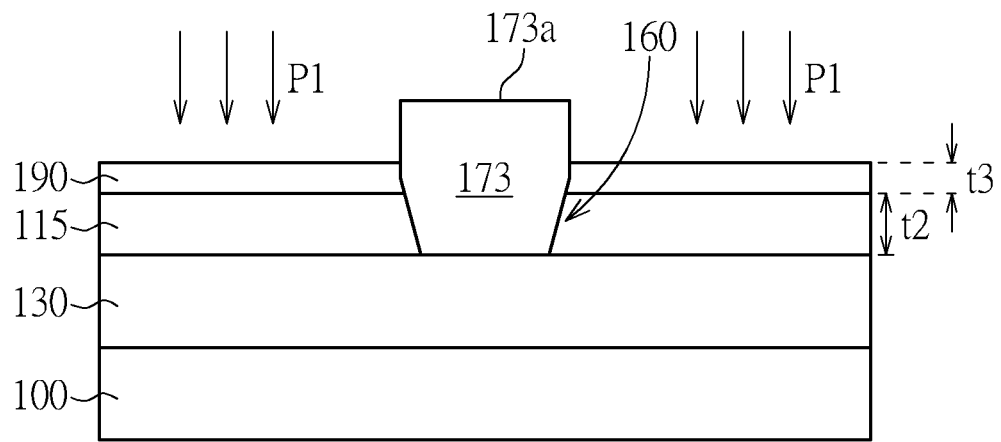

Referring to FIGS. 1-3, a method of forming a semiconductor device according to the first preferred embodiment of the present invention is shown. As shown in FIG. 1, a substrate 100 is firstly provided for supporting, and a semiconductor layer 110 is formed on the substrate 100. The substrate 100 may include any suitable supporting material, such as a glass substrate, an insulating substrate or a semiconductor based substrate such as including silicon (Si), germanium (Ge), a group III-V element or a combination thereof, and the semiconductor layer 110 may include a semiconductor material such as silicon, epitaxial silicon, germanium, epitaxial germanium, a group III-V element or a combination thereof, but not limited thereto. In one embodiment, an insulator 130 may be optionally formed on the substrate 100, between the semiconductor layer 110 and the substrate 100 as shown in FIG. 1, so that, the semiconductor layer 110, the insulator 130 and the substrate 100 may together form a silicon-on-insulator (SOI) substrate. However, in another embodiment, the semiconductor layer 110 may also be directly formed on the substrate 100 to omit the insulator 130, or the semiconductor layer 110 may directly function as a supporting substrate to omit the insulator 130 and the substrate 100.

Next, a mask structure 150 is formed on the semiconductor layer 110 to define a trench 160 within the semiconductor layer 110. Precisely, the mask structure 150 includes a first mask layer 151 and a second mask layer 153 stacked from bottom to top, and the first mask layer 151 and the second mask layer 153 preferably include different mask materials and different thicknesses. For example, in one embodiment, the first mask layer 151 includes silicon oxide ($SiO_2$), the second mask layer 153 includes silicon nitride (SiN), and a thickness ratio between the first mask layer 151 and the second mask layer 153 is about 1:8-10, but is not limited thereto. The formation of the trench 160 is for example accomplished by first forming the mask structure 150 having an opening (not shown in the drawings) disposed therein, and transferring the opening of the mask structure 150 into the semiconductor layer 110 underneath to penetrate through the semiconductor layer 110 to form the trench 160. Then, an isolating layer 170 is formed by sequentially performing a depositing process (such as a chemical vapor deposition process) and a chemical mechanical polishing process (CMP) to fill up the trench 160 and the opening, as shown in FIG. 1, with a top surface of the isolating layer 170 being coplanar with a top surface of the mask structure 150.

It is noted that, before forming the mask structure 150, the semiconductor layer 110 may be firstly processed by thinning down an original thickness (not shown in the drawings) thereof to a required thickness t1 as shown in FIG. 1, and the required thickness t1 may be about 55-60 nm in the present embodiment, but not limited thereto. In another embodiment, the required thickness t1 may be any suitable value (such as 10 nm to 60 nm) based on different product requirements.

Then, an etching back process is performed to remove a portion of the isolating layer 170 till not coplanar with the top surface of the mask structure 150. In the etching back process, the isolating layer 170 is partially removed to form an isolating structure 173 in the semiconductor layer 110 as shown in FIG. 2, with a top surface 173a of the isolating structure 173 being lower than the top surface of the mask structure 150 (namely, being lower than the top surface of the second mask layer 153 and higher than the top surface of the first mask layer 151). After that, the two mask layers 153, 151 of the mask structure 150 are sequentially and completely removed, and the isolating structure 173 may therefore partially protrude from the semiconductor layer 110 as shown in FIG. 3.

As shown in FIG. 3, an ion implanting process P1 is next performed on the semiconductor layer 110 for adjusting a threshold voltage (Vth) of a transistor formed subsequently on the semiconductor layer 110, and a sacrificial layer 190 may be firstly formed as an implanted barrier, before the ion implanting process P1. In the present embodiment, the sacrificial layer 190 may also include silicon oxide, and a formation thereof may be accomplished by performing a thermal oxidation for example. While the thermal oxidation is performed, a top portion (not shown in the drawings) of the semiconductor layer 110 may be consumed to form the sacrificial layer 190. At the same time, a relative thinner semiconductor layer 115 is obtained with a decreased thickness t2 (about 52 nm for example). It is noted that, a thickness t3 of the sacrificial layer 190 is preferably in about 50-70 angstroms, so as to avoid an excessive consumption of the semiconductor layer 110, as well as a significant loss of the requirement thickness t1.

Precisely, the ion implanting process P1 is performed through the sacrificial layer 190 to implant a dopant with a proper conductive type in the semiconductor layer 115. For example, if a PMOS transistor is intended to be formed next, an N-type dopant may be implanted into the semiconductor layer 115 for adjusting the threshold voltage of a channel thereof; and in contrast, if a NMOS transistors is formed next, a P-type dopant may be implanted into the semiconductor layer 115 for adjusting the threshold voltage of a channel thereof. In one embodiment, the N-type dopant may include arsenic (As), phosphorus (P), antimony (Sb), bismuth (Bi) or a combination thereof, and which is for example implanted at about 30-50 keV at a dose of 5E12 to 7E12 atoms/$cm^2$, preferably at about 45 keV at dose of 5.8E12 atoms/$cm^2$, through the sacrificial layer 190 with the thickness t3. In another embodiment, the P-type dopant may include boron (B), bromine fluoride (BF), aluminum (Al), gallium (Ga), indium (In) or a combination thereof, and which is for example implanted at about 10-20 keV at a dose of 5E12 to 7E12 atoms/$cm^2$, preferably at about 12 keV at dose of 6.6E12 atoms/$cm^2$, through the sacrificial layer 190 with the thickness t3, but not limited thereto.

Figure 4:
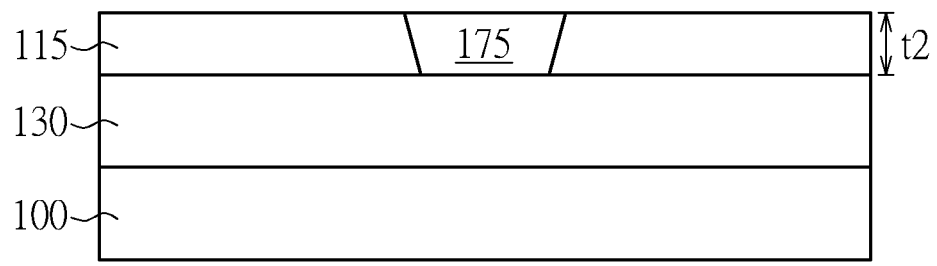

After that, as shown in FIG. 4, an etching process such as a wet etching process is performed to completely remove the sacrificial layer 190. Meanwhile, a portion of the isolating structure 173 may also be removed while removing the sacrificial layer 190, so as to form a shallow trench isolation 175 disposed within the semiconductor layer 115. Accordingly, a top surface of the STI 175 may be substantially coplanar with the top surface of the semiconductor layer 115, as shown in FIG. 4, and some active elements such as a transistor (not shown in the drawings) may then be formed on the semiconductor layer 115 in the subsequent processes.

Through the above-mentioned steps, the method of forming a semiconductor device according to the first preferred embodiment is presented, and which enables to form the STI 175 and the semiconductor layer 115 with a good uniformity with top surfaces thereof being coplanar as shown in FIG. 4. However, in the present embodiment, various oxide layers (including the first mask layer 151 and the sacrificial layer 190) are formed on the semiconductor layer 110 after the thinning-down process, and said oxide layers may further consume the semiconductor layer 110, thereby affecting the final thickness of the semiconductor layer 115. In some situation, an excessive loss of the semiconductor layer 115 may easily lead to wafer scrap risk. On the other hand, the conditions of the implantation process P1 of the present embodiment are limited by the thickness t3 of the sacrificial layer 190, so that, the threshold voltage implantation of the present embodiment may not be performed through an efficient way.

Thus, people well known in the arts should easily realize the method of forming a semiconductor device in the present invention is not limited to the aforementioned embodiment, and may further include other examples or variety. The following description will detail the different embodiments of the method of forming a semiconductor device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Please refer to FIG. 5 to FIG. 9, which are schematic diagrams illustrating a method of forming a semiconductor device according to the second embodiment of the present invention. The formal steps in the present embodiment are similar to those shown in FIG. 1 of the first embodiment, and which includes providing a substrate 300, forming an insulator 330, a semiconductor layer 310 and a mask structure 350 (including a first mask layer 351 and a second mask layer 353) on the substrate 100 from bottom to top, forming a trench 360 in the semiconductor layer 310, and forming an isolating layer (not shown in the drawings of the present embodiment) in the trench 360. The detailed features and materials of the substrate 300, the insulator 330, the semiconductor layer 310, the mask structure 350 and the isolating layer are all substantially similar to those in the first embodiment, and will not be redundantly described hereinafter. The differences between the forming method of the present embodiment and the first embodiment are mainly in the timing of the thinning-down process of the semiconductor layer 310.

Figure 5:
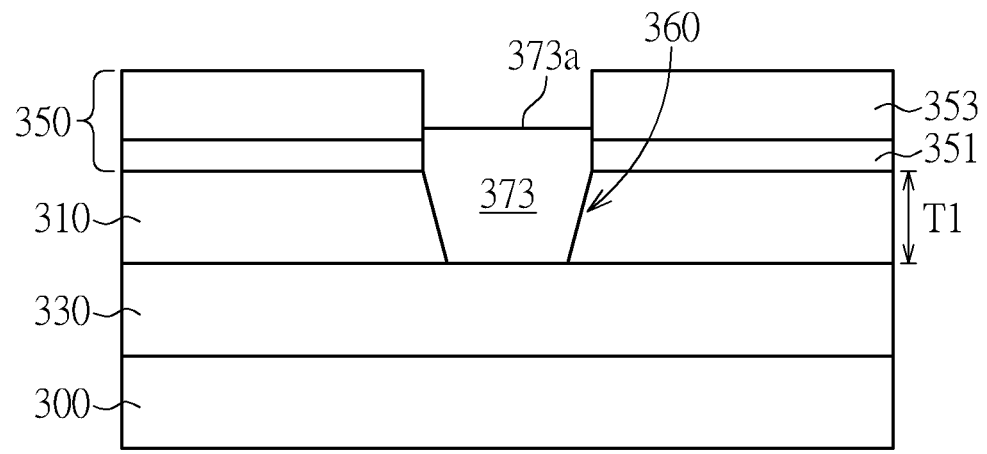
Figure 6:
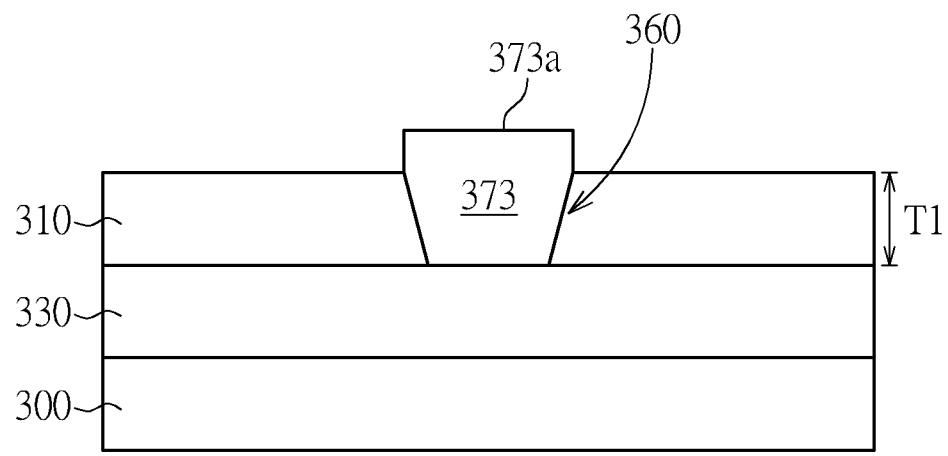

In the present embodiment, the semiconductor layer 310 has not been processed before forming the mask structure 350, and the semiconductor layer 310 may therefore have a relative greater thickness T1, such as being about 70-100 nm, preferably being about 75 nm, but is not limited thereto. Then, as shown in FIG. 5, an etching back process is performed to remove a portion of the isolating layer within the trench 360 to form an isolating structure 373, with a top surface 373a of the isolating structure 373 being lower than the top surface of the mask structure 350. In the present embodiment, since the semiconductor layer 310 will be adjusted to an expected thickness in the subsequent processes, the isolating layer of the present embodiment may be further cut down in accordance with the expected thickness. For example, the top surface 373a of the isolating structure 373 may be cut down to close to an interface between the second mask layer 353 and first mask layer 351 as shown in FIG. 5, but is not limited thereto. In other embodiments, if the expected thickness is relative thin (for example being about 10-40 nm), the top surface of the isolating structure 373 may be further cut down to lower than the top surface of the first mask layer 351; or if the expected thickness is relative thick (for example about 50-70 nm), the top surface of the isolating structure 373 may be slightly cut down to only lower than the top surface of the second mask layer 353. After that, the two mask layers 353, 351 of the mask structure 350 are sequentially and completely removed, and the isolating structure 373 may therefore partially protrude from the semiconductor layer 310 as shown in FIG. 6, with the top surface 373a thereof being higher than the top surface of the semiconductor layer 310.

Figure 7:
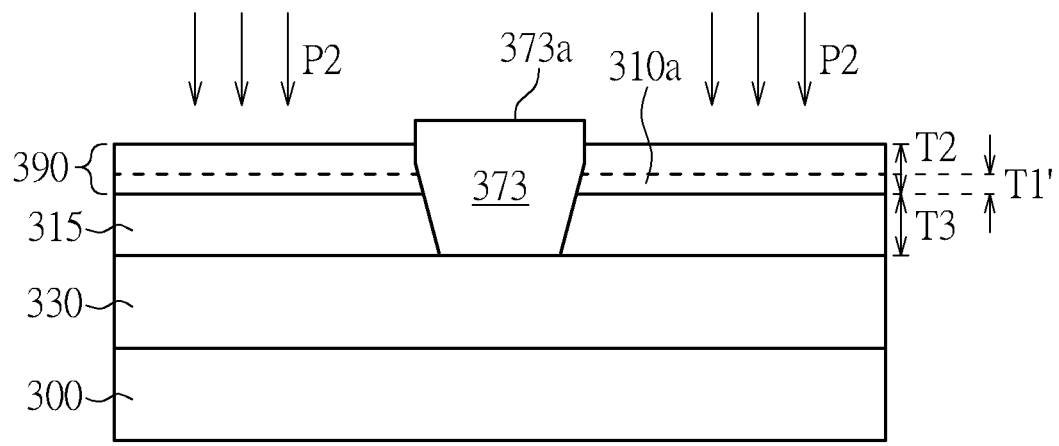

Next, as shown in FIG. 7, an ion implanting process P2 is performed on the semiconductor layer 310 for adjusting a threshold voltage of a transistor formed subsequently. Likewise, a sacrificial layer 390 is firstly formed as an implanted barrier, before the ion implanting process P2 is performed. In the present embodiment, the sacrificial layer 390 also includes silicon oxide, and a formation thereof is accomplished by performing a thermal oxidation through consuming a top portion 310a of the semiconductor layer 310. Then, a relative thinner semiconductor layer 315 with a thickness T3 is obtained under the sacrificial layer 390, as shown in FIG. 7. In one embodiment, a thickness T1' of the top portion 310a may be a quarter to a half of the semiconductor layer 310 (thickness T1), and accordingly, the sacrificial layer 390 of the present embodiment is formed to obtain a relative greater thickness T2 as shown in FIG. 7. Preferably, the thickness T1' of the top portion 310a is about one third of the semiconductor layer 310, and the thickness T2 of the sacrificial layer 390 may be equal to or larger than two times of the thickness T1', but is not limited thereto.

It is noted that, while forming the sacrificial layer 390 of the present embodiment, an expected portion (for example the top portion 310a as shown in FIG. 7) of the semiconductor layer 310 is consumed according to the expected thickness of the semiconductor layer 315. Precisely, if the expected thickness is relative thick (for example being about 40-60 nm), a relative smaller portion of the semiconductor layer 310 is requested to be consumed to form a thinner sacrificial layer (for example within about 10-20 nm); or if the expected thickness is relative thin (for example about being 10-40 nm), a relative greater portion of the semiconductor layer 310 is requested to be consumed to form a thicker sacrificial layer (for example within about 20-30 nm).

It is also noted that, according to the removed thickness of the isolating layer in the etching back process, the top surface 373a of the isolating structure 373 may be higher than the top surface of the sacrificial layer 390 after the thermal oxidation, as shown in FIG. 7. However, in another embodiment, the top surface of the isolating structure 373 may also become lower than or coplanar with the top surface of the sacrificial layer 390 after the thermal oxidation.

The ion implanting process P2 of the present embodiment is then performed also through the sacrificial layer 390 to implant a dopant with a proper conductive type in the semiconductor layer 315. For example, if a PMOS transistor is intended to be formed next, an N-type dopant may be implanted into the semiconductor layer 315 for adjusting the threshold voltage of a channel thereof; and in contrast, if a NMOS transistors is formed next, a P-type dopant may be implanted into the semiconductor layer 315 for adjusting the threshold voltage of a channel thereof. In one embodiment, the N-type dopant may include arsenic (As), phosphorus (P), antimony (Sb), bismuth (Bi) or a combination thereof, and which is for example implanted at about 40-100 keV at a dose of 1E12 to 1E13 atoms/cm$^2$, preferably at about 75 keV at dose of 6.8E12 atoms/cm$^2$, through the sacrificial layer 390 with thickness T2. In another embodiment, the P-type dopant may include boron (B), bromine fluoride (BF), aluminum (Al), gallium (Ga), indium (In) or a combination thereof, and which is for example implanted at about 10-100 keV at a dose of 1E12 to 1E13 atoms/cm$^2$, preferably at about 23 keV at dose of 8.6E12 atoms/cm$^2$, through the sacrificial layer 390 with thickness T2. Please note that, the dopants and the implanted conditions mentioned above are only for example but not limited thereto, and the detailed conditions of threshold voltage implantation may be further modified based on practical requirements.

Figure 8:
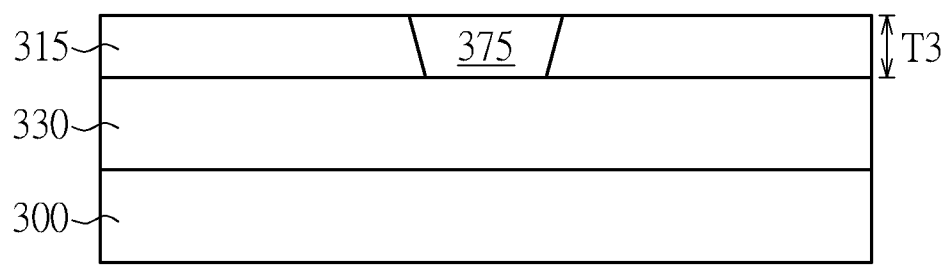
Figure 9:
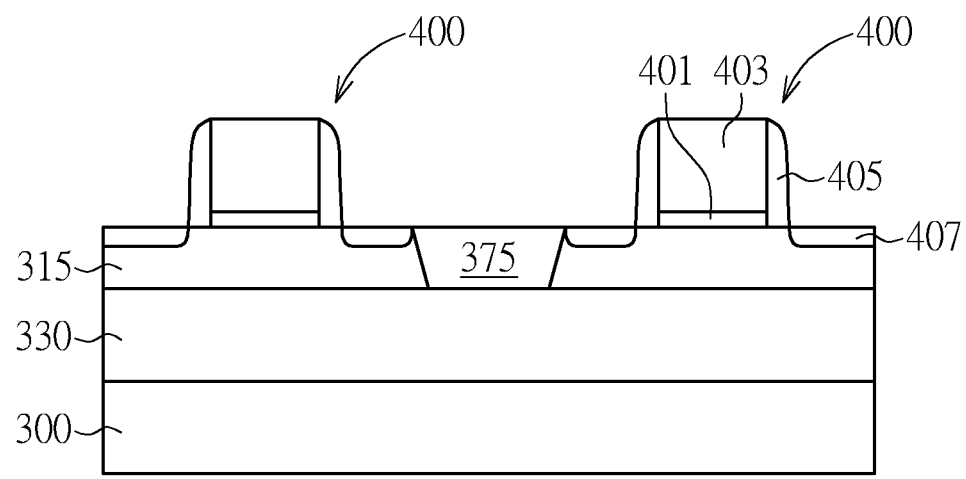

After that, as shown in FIG. 8, an etching process such as a wet etching process may be performed to completely remove the sacrificial layer 390. Meanwhile, a portion of the isolating structure 373 may also be removed while removing the sacrificial layer 390, so as to form a STI 375 disposed within the semiconductor layer 315. Accordingly, a top surface of the STI 375 may be coplanar with the top surface of the semiconductor layer 315, as shown in FIG. 8. As following, at least one transistor 400 may be formed on the semiconductor layer 315 as shown in FIG. 9. In one embodiment, the transistor 400 may include a gate insulating layer 401 and a gate electrode 403 disposed on the semiconductor layer 315, a gate spacer 405 surrounded the gate insulating layer 401 and the gate electrode 403, and source/drain regions 407 disposed at two sides of the gate electrode 403, in the semiconductor layer 315, as shown in FIG. 9. The formation of the transistor 400 may be carried out by firstly forming a gate insulating material layer (not shown in the drawings) and a gate electrode layer (not shown in the drawings), patterning the gate insulating material layer and the gate electrode layer to form the gate electrode 403 and the gate insulating layer 401, forming the spacer 405 to surround the gate electrode 403 and the gate insulating layer 401, and then forming the source/drain regions 407. However, the method of forming the transistor 400 is not limited to the above-mentioned steps and which may further include other forming steps which are well known by one skilled in the arts, such as further forming a capping layer (not shown in the drawings) on the gate electrode 403, forming an epitaxial layer (not shown in the drawings) to replace a portion of the semiconductor layer 315, or forming a metal gate structure (not shown in the drawings).

Through the above-mentioned steps, the method of forming a semiconductor device according to the second preferred embodiment is presented, and which also form the STI 375 and the semiconductor layer 315 with a good uniformity. In addition, the method of the present embodiment integrates the thinning-down process of the semiconductor layer 310 with the formation of the sacrificial layer 390, so that, the process flow thereof may be simplified by omitting the formation of some oxide layers (for example an oxide layer for an additional thinning-down process), and the cost thereof are sufficiently reduced as well. On the other hand, due to above reasons (integrated process), the thickness T2 of the sacrificial layer 390 is relative greater than that of the sacrificial layer 190 of the first embodiment, so as to become a greater barrier for the threshold voltage implantation. In this way, the ion implanting process P2 of the present embodiment are allowable to be performed under a relative greater dose and energy. As an example, the implanted dose is about 65% increase and the implanted energy is about 17% increase in comparison with that of the first embodiment while implanting the P-type dopant; and the implanted dose is about 90% increase and the implanted energy is about 30% increase in comparison with that of the first embodiment while implanting the N-type dopant. Then, the threshold voltage implantation of the present embodiment may be accomplished sufficiently to gain improved functions and reliability to the transistor 400.

Figure 10:
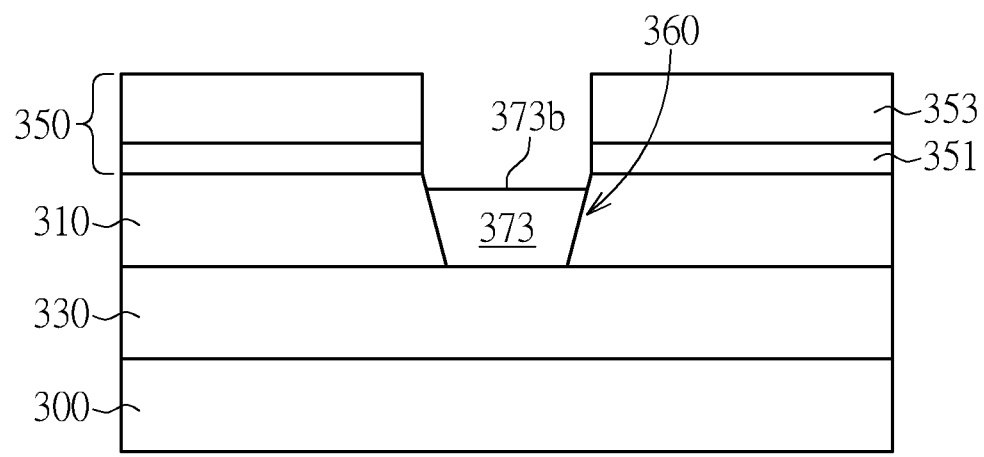
Figure 11:
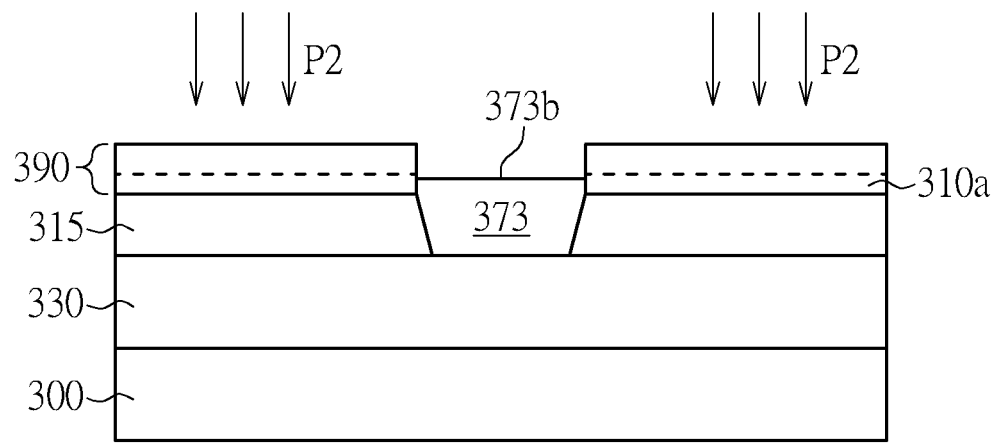

Please refer to FIG. 10 to FIG. 11, which are schematic diagrams illustrating a method of forming a semiconductor device according to the third embodiment of the present invention. The formal steps in the present embodiment are similar to those of the second embodiment, includes providing the substrate 300 and forming the insulator 330, the semiconductor layer 310, the mask structure 350 and the trench 360, and the detailed features of above elements are all substantially similar to those in the second embodiment and will not be redundantly described hereinafter. The difference between the forming method of the present embodiment and the second embodiment is mainly in removing more isolating layer in the etching back process.

As shown in FIG. 10, the top surface 373b of the isolating structure 373 is further cut down to lower than the top surface of the semiconductor layer 310 after the etching back process, in accordance with the expected thickness of an ultrathin semiconductor layer formed subsequently. Then, after forming the sacrificial layer 390 by consuming the top portion 310a of the semiconductor layer 310, the top surface 373b of the isolating structure 373 becomes lower than the top surface of the sacrificial layer 390, as shown in FIG. 11. After that, the ion implantation process P2 is also performed through similar conditions of the above second embodiment, followed by removing the sacrificial layer 390 and a portion of the isolating structure 373 simultaneously, and forming a transistor.

Through the method of forming a semiconductor device according to the third preferred embodiment, a STI (not shown in the drawings of the present embodiment) with a coplanar top surface with the top surface of the semiconductor layer 315 may also be formed, to obtain the semiconductor device with a good uniformity. Also, the method of present embodiment may also obtain other functions and advantages of the above second embodiment.

Figure 12:
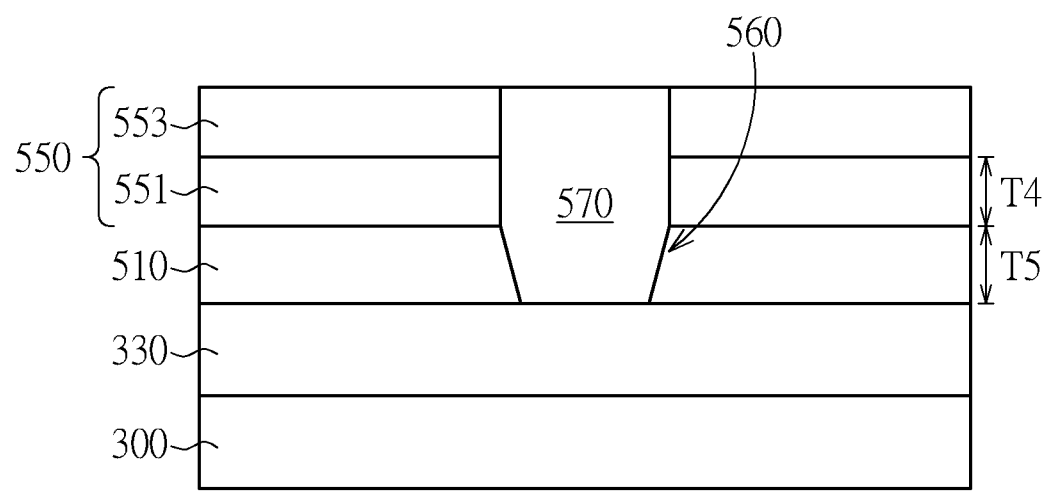
FIG. 12 is a schematic diagrams illustrating a method of forming a semiconductor device according to a fourth preferred embodiment of the present invention.

Please refer to FIG. 12, which are schematic diagrams illustrating a method of forming a semiconductor device according to the fourth embodiment of the present invention. The formal steps in the present embodiment are similar to those of the above mentioned embodiment, includes providing the substrate 300 and forming the insulator 330, and the detailed features of above elements are all substantially similar to those mentioned in the above second embodiments and will not be redundantly described hereinafter. The difference between the forming method of the present embodiment and the second embodiment is mainly in integrating the thinning-down process of the semiconductor layer 310 with the formation of the mask structure 550.

Precisely, the thinning-down process of the semiconductor layer 310 in the present embodiment is completed in advance through the formation of the first mask layer 551. The first mask layer 551 of the present embodiment may also include silicon oxide, and the formation thereof may also be accomplished by performing a thermal oxidation. Then, thermal oxidation is performed by consuming an expected portion of a semiconductor layer (not shown in the drawings), so as to form the first mask layer 551 with a relative greater thickness T4. Meanwhile, the remaining semiconductor layer may therefore form a relative thinner semiconductor layer 510 within a thickness T5 under the first mask layer 551, as shown in FIG. 12. In this way, the thickness ratio between the first mask layer 551 and the second mask layer 553 may become 1:2-5 for example, but is not limited thereto.

Next, similar to above embodiment, a trench 560 and a isolating layer 570 filled up the trench 560 are formed subsequently, followed by performing the etching back process and the threshold voltage implantation. It is noted that, in one embodiment, after forming the isolating layer 570, the mask structure 550 may be partially removed to leave the first mask layer 551 remained on the semiconductor layer 510 to perform like a barrier for the subsequent threshold voltage implantation. Under such performance, the threshold voltage implantation process may be performed by using similar implanted condition as those in the above-mentioned ion implantation process P2. However, in another embodiment, the mask structure 550 may also be completely removed after forming the isolating layer 570, and then, an additional sacrificial layer may be further formed and used as a barrier in the subsequent threshold voltage implantation. Accordingly, the threshold voltage implantation process may be performed by using similar implanted condition as those in the above-mentioned ion implantation process P1, to avoid excessive silicon consuming.

Through the method of forming a semiconductor device according to the third preferred embodiment, a STI (not shown in the drawings of the present embodiment) with a coplanar top surface with the top surface of the semiconductor layer 510 may also be formed, to obtain the semiconductor device with a good uniformity. Also, the method of present embodiment may also obtain other functions and advantages of the above second embodiment.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of forming a semiconductor device, comprising:
providing a substrate having a first semiconductor layer formed thereon;
forming an isolating structure in the first semiconductor layer, wherein a topmost surface of the isolating structure is lower than a top surface of the first semiconductor layer;
forming a sacrificial layer on the first semiconductor layer by consuming a top portion of the first semiconductor layer, wherein the topmost surface of the isolating structure is lower than a topmost surface of the sacrificial layer and is higher than a bottommost surface of the sacrificial layer; and
simultaneously removing the sacrificial layer and a portion of the isolating structure to form a second semiconductor layer and to form a shallow trench isolation (STI), with a top surface of the shallow trench isolation being coplanar with a top surface of the second semiconductor layer.

2. The method of forming a semiconductor device according to claim 1, further comprising:
forming a trench in the first semiconductor layer;
forming an isolating layer to fill up the trench; and
performing an etching back process to form the isolating structure.

3. The method of forming a semiconductor device according to claim 2, further comprises:
forming a mask structure on the first semiconductor layer to define the trench; and
completely removing the mask structure after the etching back process.

4. The method of forming a semiconductor device according to claim 1, further comprising:
performing an implanting process through the sacrificial layer.

5. The method of forming a semiconductor device according to claim 4, wherein the implanting process comprising implanting an N-type dopant with an implant energy ranged from 40 key to 100 keV.

6. The method of forming a semiconductor device according to claim 5, wherein, an implant dosage of the first conductive type dopant is 1E12 to 1E13 atoms/cm$^2$.

7. The method of forming a semiconductor device according to claim 4, wherein the implanting process comprising implanting P-type dopant with an implant energy ranged from 10 keV to 100 keV.

8. The method of forming a semiconductor device according to claim 7, wherein an implant dosage of the second conductive type dopant is 1E12 to 1E13 atoms/cm$^2$.

9. The method of forming a semiconductor device according to claim 1, further comprising:
forming a transistor on the second semiconductor layer.

10. The method of forming a semiconductor device according to claim 1, wherein the top portion of the first semiconductor layer has a first thickness and the sacrificial layer has a second thickness, and the second thickness is equal to or larger than two times of the first thickness.

11. The method of forming a semiconductor device according to claim 1, wherein the second semiconductor layer has a third thickness and the first semiconductor has a fourth thickness, and the third thickness is smaller than the fourth thickness.

12. The method of forming a semiconductor device according to claim 1, further comprising:
forming an insulator on the substrate, the insulator being disposed between the substrate and the first semiconductor layer.

13. The method of forming a semiconductor device according to claim 1, wherein the first semiconductor layer comprises silicon, germanium, a group III-V element or a combination thereof.

14. The method of forming a semiconductor device according to claim 1, wherein the substrate comprises silicon, germanium, a group III-V element or a combination thereof.

* * * * *